United States Patent [19]
Ohta et al.

[11] Patent Number: 5,142,390
[45] Date of Patent: Aug. 25, 1992

[54] MIM ELEMENT WITH A DOPED HARD CARBON FILM

[75] Inventors: Eiichi Ohta; Yuji Kimura, both of Yokohama; Hitoshi Kondo, Machida, all of Japan

[73] Assignee: Ricoh Company, Ltd., Tokyo, Japan

[21] Appl. No.: 482,893

[22] Filed: Feb. 22, 1990

[30] Foreign Application Priority Data

Feb. 23, 1989 [JP] Japan .................. 1-44673

[51] Int. Cl.$^5$ ............... G02F 1/1343; G02F 1/1333; B01J 3/06
[52] U.S. Cl. .................. 359/58; 359/79; 359/87; 423/446; 156/DIG. 68
[58] Field of Search .......... 340/784; 428/408; 156/DIG. 68; 423/446; 350/333, 332 R, 331 R, 335 US, 336 US, 334; 357/58; 359/79, 87, 58

[56] References Cited

U.S. PATENT DOCUMENTS

| | | | |
|---|---|---|---|
| 4,600,274 | 7/1986 | Morozumi | 350/339 F |
| 4,932,331 | 6/1990 | Kurihara et al. | 423/446 X |
| 5,015,494 | 5/1991 | Yamazaki | 423/446 X |

FOREIGN PATENT DOCUMENTS

| | | |
|---|---|---|
| 62-291081 | 12/1987 | Japan . |
| 64-40929 | 2/1989 | Japan . |
| 64-55540 | 3/1989 | Japan . |

OTHER PUBLICATIONS

Spitsyn et al, Progress in Crystal Growth and Characterization, vol. 17, No. 2, Dec. 1988, "Diamond and Diamond Like Films: Deposition . . . Properties", pp. 154–156.

Han et al., Diamond and Diamond-Like Materials Synthesis, Apr. 9, 1988, "Iron Doped Amorphous Hydrogenated Carbon Nitride", pp. 23–26.

Ebihara et al., Diamond and Diamond-Like Materials Synthesis, Apr. 9, 1988, "Amorphous Carbon Film Preparation Using a Reactive Pulsed Inductive Plasm", pp. 45–48.

Woollam et al, Technology Update on Diamond Films, Apr. 25, 1989, "Diamondlike Carbon as a Moisture Barrier and Antireflecting Coating on Optical Materials", pp. 27–32.

Primary Examiner—Stanley D. Miller
Assistant Examiner—Ron Trice
Attorney, Agent, or Firm—Oblon, Spivak, McClelland, Maier & Neustadt

[57] ABSTRACT

Disclosed herein is an MIM device having a hard carbon film as the insulator. The hard carbon film contains at least one of the following elements: a group III element, a group IV element, a group V element, an alkali metal element, an alkaline earth metal element, nitrogen, oxygen, a chalcogen element or a halogen element.

18 Claims, 5 Drawing Sheets

MIM ELEMENT WITH A DOPED HARD CARBON FILM

BACKGROUND OF THE INVENTION

The present invention relates to an MIM (metal-insulator-metal) device which is useful as a switching device and, in particular, a switching device for use in liquid crystal display.

As a typical example of thin film 2-terminal device, an MIM device may be exemplified. Conventional MIM devices are disclosed in, for example, Japanese Patent Application Laid-Open (KOKAI) Nos. 62.62333 (1987) and 61.260129 (1986).

Specifically, Japanese Patent Application Laid-Open (KOKAI) No. 62.62333 (1987) discloses an MIM device comprising a tantalum (Ta) thin film formed by sputtering as a lower electrode, a tantalum oxide ($Ta_2O_5$) film formed by anodic oxidizing tantalum of the lower electrode as an insulator, and a Cr film formed by vapor deposition, or indium - tin oxide (ITO) film formed by further applying ion-plating vapor deposition, that is, Cr/ITO film as an upper electrode.

Japanese Patent Application Laid-Open (KOKAI) Nos. 61-260219 (1986) discloses a non-linear resistance device comprising an indium-tin oxide (ITO) film formed by magnetron sputtering as a lower electrode, an amorphous film mainly composed of silicon such as a silicon oxide film or a silicon nitride (SiNx) film formed by plasma CVD as an insulator, and a chromium film or a metal film of Al, Cu, NiCu, Ag or Au formed by sputtering as an upper electrode.

These MIM devices are utilized, in particular, as switching devices for use in liquid crystal display of active matrix system. However, the MIM device disclosed in Japanese Patent Application Laid-Open (KOKAI) Nos. 62-62333 (1987) has the following drawbacks:

(1) Since the insulator is formed by the anodic oxidation of the lower electrode metal film, it is difficult to prepare a film having desired physical properties and thus, the control for the device characteristics is not easy, and accordingly the degree of freedom for the device design is restricted.

(2) In the case of using the device for a liquid crystal display, since the rubbing treatment for orienting liquid crystals in a predetermined direction is necessary, an insulator layer of large thickness or high hardness, for example, Vickers hardness of not less than about 2000 kg/mm² is required so as to be free from mechanical damages for the film or the device. However, the anodic-oxidized film is soft and the film thickness has to be kept not less than about 600 Å in view of the current-voltage characteristic and driving voltage.

(3) In the case of the anodic-oxidized film, the heat treatment at about 300°-500° C. is necessary in order to obtain symmetrical polarity. So, there is imposed a restriction on the material of the substrate.

(4) In a case of using the device for a liquid crystal, since a ratio of capacitance in liquid crystal portion ($C_{LCD}$) to device capacitance ($C_{MIM}$) of not smaller than about 10/1 is necessary, the lower dielectric constant of the insulator is more advantageous for fabrication. However, since anodic-oxidized film such as $Ta_2O_5$ has high dielectric constant (about 25 in the case of $Ta_2O_5$), it requires highly fine fabrication technique and creates a difficulty as to the preparation of the device with a large area at high yield.

On the other hand, the MIM device as disclosed in Japanese Patent Application Laid-Open (KOKAI) No. 61-260219 (1986) can overcome the foregoing drawbacks (1), (2) and (4), but it also involves the drawback as in (3) above since the film-deposition temperature is as high as about 300° C. Moreover, it also has the following drawbacks.

(5) In the case of preparing a large area device, the film thickness and film quality tend to become non-uniform because of the variation of the temperature distribution on a substrate and accordingly, it is not suitable as a thin film device.

(6) Further, since a lot of pin-holes are formed due to dusts generated in a gas phase upon film deposition, the production yield of the device is lowered, or peeling is liable to occur because of large film-stresses which also causes the reduction of the yield.

As a result of present inventors' earnest studies for solving the above mentioned problems in the conventional MIM device, it has been found that an MIM device having a great degree of freedom in view of device design, having high mechanical strength, and being free from restriction as to the material of a substrate and suitable to thin film device as well as for ease of preparation of larger area and of improved with film properties such as hardness, stability, etc. can be obtained by using in an MIM device comprising a lower electrode, an upper electrode and an insulator sandwiched therebetween as an insulator layer, a hard carbon film containing as the constituent element, carbon atom, hydrogen atom and at least one of elements selected from the group consisting of group III element, group IV element and group V element of the periodical table, alkali metal element, alkaline earth metal element, nitrogen atom, oxygen atom, chalcogen element and halogen atom. The present invention has been accomplished based on this finding.

SUMMARY OF THE INVENTION

In an aspect of the present invention, there is provided an MIM device comprising a lower electrode, a hard carbon film disposed on the lower electrode, as an insulator, containing at least one of elements selected from the group consisting of group III element, group IV element other than carbon and group V element of the periodic table, alkali metal element, alkaline earth metal element, nitrogen atom, oxygen atom, chalcogen element and halogen atom, and an upper electrode disposed on the insulator layer.

DETAILED DESCRIPTION OF THE INVENTION

The hard carbon film as the insulator layer used in the MIM device according to the present invention is constituted with materials containing at least one of amorphous and microcrystalline material comprising carbon atoms and hydrogen atoms as the main constituent elements, which are also referred to as i-C film, diamond-like carbon film, amorphous diamond film and diamond thin film. As the constituent element for the hard carbon film according t the present invention, there may be used, in addition to the carbon atoms and the hydrogen atoms, at least one of elements selected from the group consisting of group III element, group IV element other than carbon and group V element of the periodical table, alkali metal elements, alkaline earth metal elements, nitrogen atom, oxygen atom, chalcogen elements or halogen atom.

For forming the hard carbon film in the present invention, a mixture of a gas of an organic compound, preferably a hydrocarbon gas with a gas of another compound described later is used as the starting gas material. The starting material is not necessarily in a gas phase under normal temperature and normal pressure, and any material in a liquid or solid phase under normal temperature and normal pressure may also be used so long as it is gasifiable by way of melting, evaporization, sublimation, etc. by heating or reduced pressure.

For the hydrocarbon gas as the starting gas material, all of hydrocarbons may be used such as paraffin hydrocarbons, for example, $CH_4$, $C_2H_6$, $C_3H_8$ and $C_4H_{10}$; olefin hydrocarbons, for example, $C_2H_4$ and $C_3H_6$; acetylene hydrocarbons such as $C_2H_2$; diolefin hydrocarbons; and aromatic hydrocarbons.

Further, in addition to hydrocarbons, those compounds capable of forming carbon such as alcohols, ketones, ethers, esters, CO and $CO_2$ may also be used. However, if CO or $CO_2$ is used, hydrogen or hydrocarbons may be used, as occasion demands.

For incorporating of at least one of elements selected from the group consisting of group III element, group IV element other than carbon and group V element of the periodic table, alkali metal elements, alkaline earth metal elements, nitrogen atom, oxygen atom, chalcogen elements or halogen atom as the third ingredient element, a gas of a compound (or molecule) containing these elements (hereinafter sometimes referred to as "other compound") in addition to the organic compound gas and, hydrogen gas used if necessary, is used as the starting gas material.

As a compound containing the element belonging to the group III of the periodic table, there can be exemplified $B(OC_2H_5)_3$, $B_2H_6$, $BCl_3$, $BBr_3$, $BF_3$, $Al(O-i-C_3H_7)_3$, $(CH_3)_3Al$, $(C_2H_5)_3Al$, $(i-C_4H_9)_3Al$, $AlCl_3$, $Ga(O-i-C_3H_7)_3$, $(CH_3)_3Ga$, $(C_2H_5)_3Ga$, $GaCl_3$, $GaBr_3$, $(O-i-C_3H_7)_3In$, $(C_2H_5)_3In$.

As a compound containing the element other than carbon belonging to the group IV of the periodic table, there can be exemplified $SiH_4$, $Si_2H_6$, $Si_3H_6$, $(C_2H_5)_3SiH$, $SiF_4$, $SiH_2Cl_2$, $SiCl_4$, $Si(OCH_3)_4$, $Si(OC_2H_5)_4$, $Si(OC_3H_7)_4$, $GeCl_4$, $GeH_4$, $Ge(OC_2H_5)_4$, $Ge(C_2H_5)_4$, $(CH_3)_4Sn$, $(C_2H_5)_4Sn$, $SnCl_4$.

As a compound containing the element belonging to the group V of the periodic table, there can be exemplified $PH_3$, $PF_3$, $PCl_2F_3$, $PCl_3$, $PCl_2F$, $PBr_3$, $PO(OCH_3)_3$, $P(C_2H_5)_3$, $POCl_3$, $AsH_3$, $AsCl_2$, $AsBr_3$, $AsF_3$, $AsF_5$, $AsCl_3$, $SbH_3$, $SbF_3$, $SbCl_3$, $Sb(OC_2H_5)_3$.

As the compound containing the alkali metal elements, there can be exemplified $LiO-i-C_3H_7$, $NaO-i-C_3H_7$ and $KO-i-C_3H_7$.

As the compound containing the alkaline earth metal elements, there can be exemplified $Ca(O_2H_5)_3$, $Mg(OC_2H_5)_2$ and $(C_2H_5)_2Mg$.

As the compound containing the nitrogen atom, there can be exemplified nitrogen gas, inorganic compound such as ammonia, organic compounds having functional group such as amino group and cyano group, and a heterocyclic ring containing nitrogen, etc.

As the compound containing the oxygen atom, there can be exemplified inorganic compound such as oxygen gas, ozone, water (steam), hydrogen peroxide, carbon monoxide, carbon dioxide, carbon sub-oxide, nitrogen monoxide, nitrogen dioxide, dinitrogen trioxide, dinitrogen pentoxide, nitrogen trioxide, etc.; organic compounds containing functional group or bonding such as hydroxy group, aldehyde group, acyl group, ketone group, nitro group, nitroso group, sulfone group, ether bonding., ester bonding, peptide bonding and heterocyclic ring containing oxygen; and metal alkoxide.

As the compound containing chalcogen elements, there can be exemplified $H_2S$, $(CH_3)(CH_2)_4S(CH_2)_4CH_3$, $CH_2=CHCH_2SCH_2CH=CH_2$, $C_2H_5SC_2H_5$, C? $H_5SCH_3$, thiophene, $H_2Se$, $(C_2H_5)_2Se$, $H_2Te$, etc.

Further, as the compound containing halogen atom, there can be exemplified inorganic compounds such as fluorine, chlorine, bromine, iodine, hydrogen fluoride, chlorine fluoride, bromine fluoride, iodine fluoride, hydrogen chloride, bromine chloride, iodine chloride, hydrogen bromide, iodine bromide and hydrogen iodide; and organic compounds such as alkyl halide, aryl halide, styrene halide, polymethylene halide and haloform.

The amount of hydrogen atom contained as one of the constituent elements in the hard carbon film according to the present invention is from 10 to 50 atomic %, preferably 20 to 45 atomic % based on the whole constituent atoms. Also, the amount of carbon atom contained as one of the constituent elements in the hard carbon film according to the present invention is from 50 to 90 atomic %, preferably 55 to 80 atomic % based on the whole constituent atoms.

Further, the amount of the element belonging to the group III of the periodic table, contained as one of the constituent elements in the hard carbon film according to the present invention is not more than 5 atomic %, preferably from 0.001 to 3 atomic % based on the whole constituent atoms.

The amount of the group IV element other than carbon therein is not more than 20 atomic %, preferably from 0.01 to 17 atomic based on the whole constituent atoms.

The amount of the group V element therein is not more than 5 atomic %, preferably from 0.001 to 3 atomic based on the whole constituent atoms.

The amount of the alkali metal element therein is not more than 5 atomic %, preferably from 0.001 to 3 atomic % based on the whole constituent atoms.

The amount of the alkaline earth metal element therein is not more than 5 atomic %, preferably from 0.001 to 3 atomic % based on the whole constituent atoms.

The amount of the nitrogen atom element therein is not more than 5 atomic %, preferably from 0.001 to 3 atomic % based on the whole constituent atoms.

The amount of the oxygen atom element therein is not more than 5 atomic %, preferably from 0.001 to 3 atomic % based on the whole constituent atoms.

The amount of the chalcogen element therein is not more than 20 atomic %, preferably from 0.01 to 17 atomic % based on the whole constituent atoms.

The amount of the halogen element therein is not more than 35 atomic %, preferably from 0.1 to 35 atomic % based on the whole constituent atoms.

The amount of the element or the atom described above can be measured by the customary method for elemental analysis, for example, Auger analysis. Further, the amount of the element or atom is controllable depending on the amount of other compounds contained in the starting gas material, film-forming conditions, etc. The amount of the element or atom contained in the film does not coincide with the flow-rate ratio of the compound in the starting gas material. The amount taken into the film is different depending on the kind of gas, film-forming conditions, etc. and it is about 50% or less.

Accordingly, the ratio of the respective other compounds based on the carbon-containing compound in the present invention are as below:

The amount of the compound containing the group III element is not more than 15 vol. %, preferably from 0.001 to 10 vol. %.

The amount of the compound containing the group IV element other than carbon is not more than 50 vol. %, preferably from 0.01 to 25 vol. %.

The amount of the compound containing the group V element is not more than 15 vol. %, preferably from 0.001 to 10 vol. %.

The amount of the compound containing alkali metal element is not more than 15 vol. %, preferably from 0.001 to 10 vol. %.

The amount of the compound containing alkaline earth metal element is not more than 15 vol. %, preferably from 0.001 to 10 vol. %.

The amount of the compound containing nitrogen atom is not more than 15 vol. %, preferably from 0.001 to 10 vol. %.

The amount of the compound containing oxygen atom is not more than 15 vol. %, preferably from 0.001 to 10 vol. %.

The amount of the compound containing chalcogen element is not more than 50 vol. %, preferably from 0.01 to 25 vol. %.

The amount of the compound containing halogen atom is not more than 85 vol. %, preferably from 0.1 to 70 vol. %.

As the method of forming the hard carbon film from the starting gas material as described above in the present invention, it is most preferred to use a method in which active species of ions or radicals derived from the starting gas material in a gas phase are formed by way of a plasma state generated by a plasma method using direct current, low frequency wave, high frequency wave or microwave, etc. In addition, they may be formed by way of ionized states generated by ionizing vapor deposition or ion beam vapor deposition, or they may be formed from neutral species formed by vacuum vapor deposition or sputtering. Furthermore, they may be formed by the combination of them.

On example for the deposition conditions of the hard carbon film thus prepared in the case of the plasma CVD process is as shown below.

| | |
|---|---|
| RF power | 0.1–50 W/cm$^2$ |
| Pressure | $10^{-3}$–10 Torr |
| Deposition temperature | room temperature - 950° C., preferably room temperature - 300° C. |

One example of the physical property of the film prepared under such deposition conditions and the nonlinear characteristics of the MIM device are as shown below.

| | |
|---|---|
| Specific resistivity ($\rho$) | $10^6$–$10^{14}$ ohm · cm, preferably $10^6$–$10^{13}$ ohm · cm |
| Vickers hardness (H) | 2500 to 9500 kg · mm$^{-2}$, preferably 3000–9500 kg · mm$^{-2}$ |
| Index of Refraction (n) | 1.7–2.6, preferably 1.9 to 2.4 |
| Defect density | $10^{16}$–$10^{19}$ cm$^{-3}$, preferably $10^{17}$ to $10^{19}$ cm$^{-3}$ |
| Steepness characteristics $\beta$ | 2–18, preferably 2.5–12 to. |

(Specific resistivity is measured based on I-V characteristic by a coplanar-type cell, and Vickers hardness, reflectance and defect density are measured, respectively by micro vickers meter, ellipso meter and ESR.)

According to X-ray and electron diffractiometry, it is known that the film is in an amorphous state (a-C:H) or in such an amorphous state containing microcrystal grains of about 50 Å to 5 μm (including a state containing many microcrystal grains or a state containing much amorphous ingredient).

Figure 1:
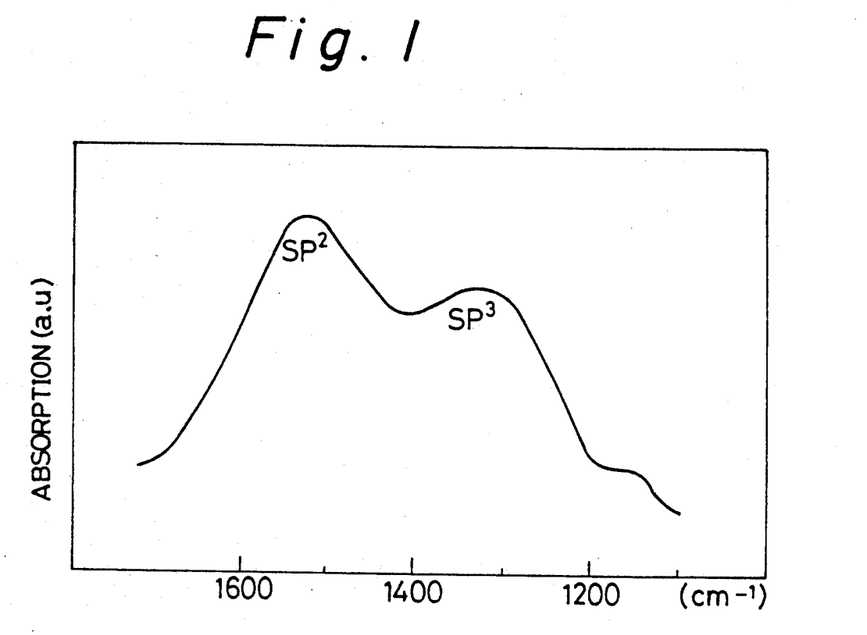
FIGS. 1 and 2 are, respectively, Raman and IR spectral charts of the hard carbon film used for an MIM device of the present invention showing relative strengths of absorption.
Figure 2:
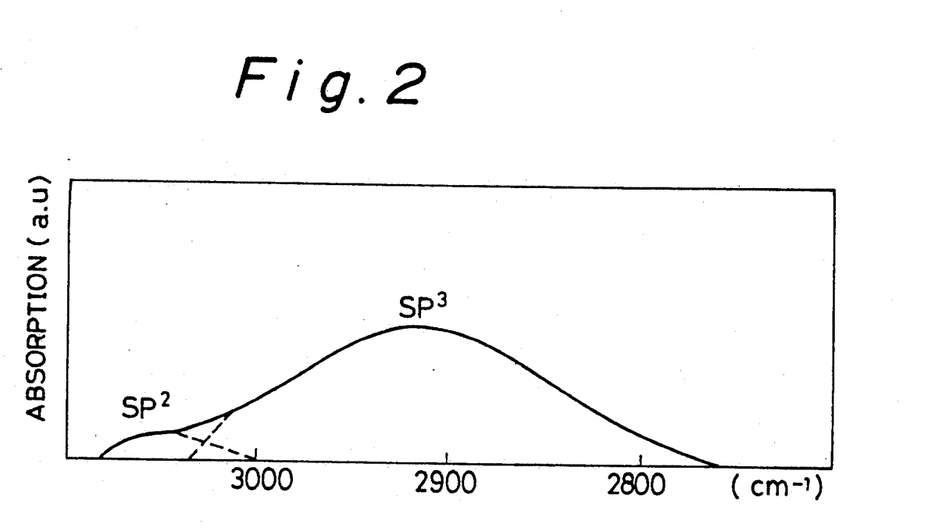

Further, as a result of Raman spectroscopy and IR absorption spectrophotometry, it has been known that carbon atoms in SP$^3$ hybrid orbital and carbon atoms of SP$^2$ hybrid orbital in view of interatom bondings are present together as shown in FIGS. 1 and 2. Such a hard carbon film includes those mainly comprising SP$^3$ carbon atoms and containing SP$^2$ carbon atoms, and those mainly comprising SP$^2$ carbon atoms and containing SP$^3$ carbon atoms. Further, in the film deposition, the specific resistivity and the hardness of the film are increased as the RF power is smaller and the pressure is lower, and as the hydrogen mixing ratio is greater, the refraction is increased and the defect density is decreased, thereby obtaining a high quality film.

By forming the insulator layer of the MIM device with the hard carbon film, scattering in the device characteristics can be reduced, to obtain an MIM device capable of withstanding mechanical damages. In the case of using the MIM device as a switching device used for a liquid crystal device, damages caused by the rubbing step upon sealing liquid crystal material is reduced and the yield can be improved. Further, while $C_{LCD}/C_{MIM}$ ratio of not smaller than about 10/1 is necessary for the electric capacitance between LCD and MIM device as described above, an insulator of lower specific dielectric constant is more advantageous for fabrication. In the present invention, since the specific dielectric constant $\epsilon_r$ of the hard carbon film is as small as 2 to 6, the device can be formed at a high accuracy without requiring very high precision fabrication and the yield can be improved.

The film thickness of the hard carbon film containing group III element of the periodic table group V element of the periodic table, alkali metal element, alkaline earth metal element, nitrogen atom or oxygen atom as one of constituent elements of the film can be increased by about 2-3 times as compared with that of the non-doped film (film not containing such device ). Further, this can prevent occurrence of pin-holes upon manufacturing the device and outstandingly improve the mechanical strength of the device.

The hard carbon film containing nitrogen atom, oxygen atom, group IV element other than carbon, chalcogen element or halogen element is outstandingly improved for thermal stability and the film hardness, and accordingly an device of high reliability can be manufactured. These effects can be obtained, in the case of oxygen atom, group IV element other than carbon and chalcogen element since they reduce active double bonds present in the hard carbon film; in the case of halogen element since (1) the decomposition of the starting material gas is accelerated due to extracting reaction to hydrogen, thereby decreasing the dangling bond in the film and (2) the halogen atom X extracts and substitutes hydrogen in the C-H bond and enters into the film as the C-X bond, thereby increasing the bonding energy (bonding energy between C-X is greater than that between C-H); and in the case of nitrogen atom since it is effective for the activation of the starting material gas in the gas phase reaction because of its highly excited state.

Then, description will be made for a liquid crystal display using the MIM device according to the present invention.

As the substrate, a transparent insulation plate such as a glass plate, plastic plate or flexible plastic film is used. A picture element electrode is disposed to one of the transparent substrates and at least one MIM device and a common electrode wiring are disposed to the picture element electrode. In this case, the picture element electrode is formed on the substrate by depositing a transparent electrode material such as ITO, $SnO_2$, $In_2O_3$, ZnO:Al, ZnO:Si, $SnO_2$:Sb, etc. to a thickness from about 300 to 5000 Å by sputtering, vapor deposition, CVD, etc. followed by patterning. Then, a lower electrode is formed on the said transparent electrode. The lower electrode is formed by depositing highly electroconductive material such as Al, Ni, Ni-Cr alloy, Mo, Cr, Ti, Zr, Nb, Au, Ag, Pt or Cu by sputtering, vapor deposition, CVD, etc. to a thickness of about from 100 to 5000 Å and then patterning the film to a predetermined pattern by a photolithographic etching process.

Then, a hard carbon film is deposited to a film thickness of from 100 to 8000 Å, preferably from 200 to 600 Å by using the method described above, which is then patterned into a predetermined pattern by a photolithographic etching process.

Successively, the same highly electroconductive material as that of the lower electrode is used as a raw material of an upper electrode, which is deposited to a thickness of from 300 to 5000 Å by sputtering, vapor deposition, CVD, etc. which is then patterned by photolithographic etching process. Thus, a liquid crystal display substrate using the MIM device according to the present invention can be obtained.

The constitution of the MIM device is not restricted only to that described above but various constitutions are possible, in which a transparent electrode is disposed to the uppermost layer after the preparation of the MIM device, the transparent electrode serves both as the upper or the lower electrode, an MIM device is formed on the side of the lower electrode, etc.

An orientation layer of polyimide, etc. is disposed as the orientation film, to the thus obtained liquid crystal display substrate and the opposed transparent substrate having a common transparent electrode, and rubbing treatment is applied thereto.

Then, the respective substrates are opposed with their electrodes being at the inner side and joined by means of a gap material (spacer) therebetween and further, liquid crystal material is sealed in the thus formed cell to obtain a liquid crystal display.

Although the foregoing descriptions have been made for the liquid crystal display of black and white display, the present invention is not restricted only thereto but a color liquid crystal display having a color filter to the inside or the outside of the cell may be used.

The current-voltage characteristic (I-V characteristic) of the MIM device in the present invention is approximated by the following conduction formula:

$$I = k \exp(\beta V^{\frac{1}{2}}) \quad (1)$$

wherein
  k: conduction coefficient
  $\beta$: Pool-Frenkel coefficient (coefficient representing the steepness of I-V characteristic, hereinafter referred to as steepness)

Relationship between k, $\beta$ and various physical properties of the hard carbon film is represented by the following formulae:

$$\kappa = \frac{n\mu q}{d} \exp\left(\frac{-\phi}{kT}\right) \propto \frac{1}{\rho d} \quad (T = \text{constant}) \quad (2)$$

$$\beta = \frac{1}{kT}\left(\frac{q^3}{\pi\epsilon\epsilon_0 d}\right)^{\frac{1}{2}} \propto \frac{1}{\sqrt{\epsilon_r d}} \quad (T = \text{constant}) \quad (3)$$

wherein
  n : carrier density
  $\mu$ : carrier mobility
  q : charging amount of electrons
  $\phi$ : trap depth
  $\rho$ : specific resistivity
  d : thickness of hard carbon film
  k : Boltzman constant
  T : atmospheric temperature
  $\epsilon_r$ : specific dielectric constant of hard carbon film
  $\epsilon_0$ : dielectric constant in vacuum The merits of using the hard carbon film in view of the formulae (2) and (3) are considered as described below:

(i) Since the specific dielectric constant $\epsilon_r$ of the hard carbon film is as small as 2-6, the steepness $\beta$ is larger as compared with other insulators (for example, $Ta_2O_5$, $Al_2O_3$, $SiO_2$, $SiN_x$, $SiC_x$, etc.) and the ratio of ON current ($I_{ON}$) to OFF current ($I_{OFF}$) can be made greater, liquid crystals can be driven at a lower duty ratio, thereby realizing a high density (highly accurate) LCD. Further, since low specific dielectric constant of the film allows a larger size for the device upon preparing a device with an identical electrical capacitance, high precision fabrication is not required and the yield can be improved (in view of the driving conditions, the capacitance ratio ($C_{LCD}$ / $C_{MIM}$) of not smaller than about 10/1 is necessary between the capacitance of LCD and MIM).

(ii) Since the specific resistivity ρ of the hard carbon film can be controlled within a wide range of $10^6$ to $10^{14}$ Ω·cm, the electroconduction coefficient k can freely be varied so as to be suitable for the specification demanded for LCD. That is, there is also a merit that the device can be designed and controlled with ease.

Figure 3A:
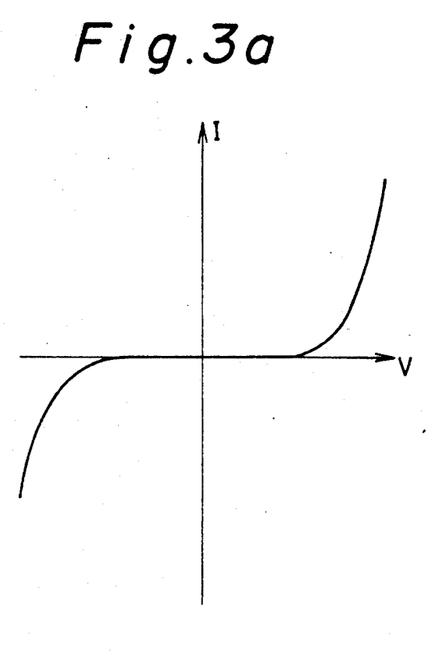
FIGS. 3(a) and (b) are, respectively, charts for typical I-V characteristics and $\ln I$-$\sqrt{v}$ characteristic of an MIM device of the present invention.
Figure 3B:
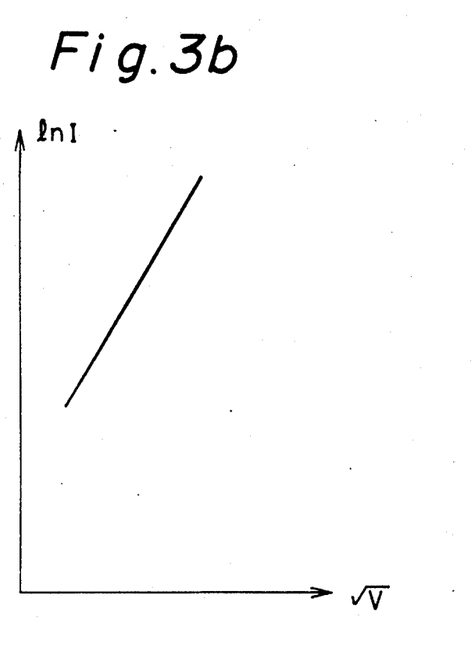
Figure 4:
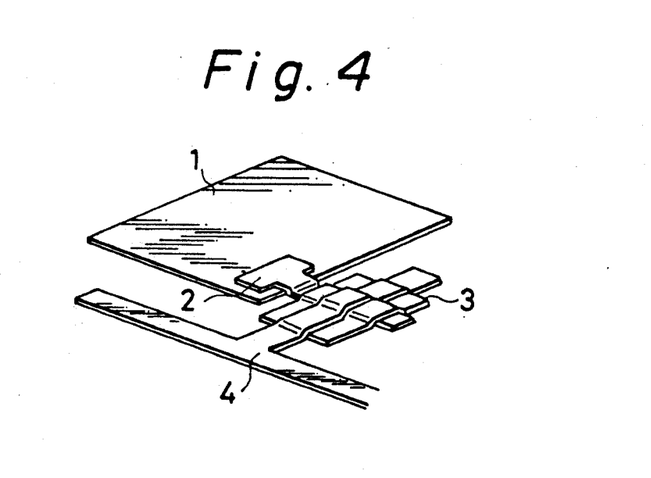
FIG. 4 is a typical constitutional view of an MIM device of the present invention.

FIGS. 3 and 4 show respectively, the typical I-V characteristics and the device constitution of the MIM element according to the present invention. In FIG. 4 are shown a transparent picture element electrode 1, a lower electrode 2, a hard carbon film 3 and an upper portion and scanning electrode 4.

In the MIM device according to the present invention, since hard carbon film as the insulator has various advantages as shown below, it is suitable, particularly, to a switching device for use in a highly reliable liquid crystal display.

(1) Since the hard carbon film is formed by gas phase synthesis method such as plasma CVD, etc., physical properties thereof can be controlled over a wide range depending on film-forming conditions, and accordingly, the degree of freedom for the device design is great.

(2) Since the hard carbon film can be formed hard and thick, it undergoes less mechanical damages and decrease of pin-holes owing to the increased thickness can be expected.

(3) Since a hard carbon film of good quality can be formed even under low temperature near the room temperature, there is no restriction for the material of the substrate.

(4) Since the hard carbon film is excellent in the uniformness of thickness and quality, the film is suitable for thin-film devices.

(5) Since the specific dielectric constant thereof is low, it requires no high precision fabrication technique, which is advantageous for increasing the area of the device.

Further, in the hard carbon film containing the group III element, group V element, alkali metal element, alkaline earth metal element, nitrogen atom or oxygen atom as one of the constituent elements for the film, the film thickness can be increased by about 2-3 times as compared with the non-doped film (film not containing such element), which can prevent occurrence of pin-holes more effectively upon manufacturing the device and also outstandingly improve the mechanical strength of the device. Further, in the case of containing nitrogen atom or oxygen atom, the same effect as in the group IV element of the periodic table, etc. can be obtained.

In the hard carbon film containing the IV group element other than carbon of the periodic table, chalcogen element or halogen element, the heat-stability of the film can be outstandingly improved and, being coupled with the improvement for the film hardness, a highly reliable device can be manufactured.

The liquid crystal display having such a device as a switching device has the following merits:

(1) Since characteristic optimum to liquid crystal driving can be obtained, high contrast and greater capacitance can be attained.

(2) Since the device defects are decreased, there are less display defects.

(3) Since device characteristic is excellent in uniformity, large area display is possible and it is advantageous for multi-graduation display.

(4) Since there is no restriction for the material of the substrate, reduction of cost, weight and thickness can be realized by using plastic, etc.

(5) In addition, since the device defects can further be decreased by doping such element to the hard carbon film (by introducing such element to the hard carbon film), the number of defective picture elements is remarkably reduced and liquid crystal display of excellent display quality can be manufactured at a high yield.

(6) Further, since the heat-stability of the device characteristic can be improved, a liquid crystal display with less degradation of display quality and high reliability can be obtained.

The present invention will be more precisely explained while referring to Examples as follows.

However, the present invention is not restricted to Examples under mentioned. From the foregoing description, one skilled in the art can easily ascertain the essential characteristics of the present invention, and without departing from the spirit and scope thereof, can make various changes and modifications of the invention to adapt it various usages and conditions.

EXAMPLES 1-9

After depositing ITO to a thickness of 1000 Å as one of transparent substrates by sputtering on a pyrex glass substrate, it was patterned to form a picture element electrode. Then, an MIM device was disposed as an active device as described below. At first, Al was deposited to a thickness of 1000 Å on the picture element electrodes of the substrate by vapor deposition and then patterned to form a lower electrode. Then, after depositing a hard carbon film as an insulator layer to a thickness of 900 Å on the lower electrode by plasma CVD, it was patterned by dry etching. The film forming conditions in this case are as shown below.

| | |
|---|---|
| Pressure | 0.035 Torr |
| Starting material gas composition | As in Table 1 |
| Total flow rate | 20 SCCM |
| RF power | 0.2 W/cm² |

TABLE 1

| | Composition of starting gas (vol. %) | | Composition of hard carbon film (atomic %) |
|---|---|---|---|
| Example 1 | $\dfrac{B_2H_6}{CH_4 + H_2 + B_2H_6} = 5\%$ | $\dfrac{CH_4}{CH_4 + H_2 + B_2H_6} = 85\%$ | C: 69.99<br>H: 30.00<br>B: 0.01 |
| Example 2 | $\dfrac{SiH_4}{CH_4 + H_2 + SiH_4} = 5\%$ | $\dfrac{CH_4}{CH_4 + H_2 + SiH_4} = 85\%$ | C: 66.9<br>H: 28.6<br>Si: 4.5 |

TABLE 1-continued

| | Composition of starting gas (vol. %) | Composition of hard carbon film (atomic %) |
|---|---|---|
| Example 3 | $\dfrac{PH_3}{CH_4 + H_2 + PH_3} = 5\%$, $\dfrac{CH_4}{CH_4 + H_2 + PH_3} = 85\%$ | C: 69.99<br>H: 30.00<br>P: 0.01 |
| Example 4 | $\dfrac{LiO - i\text{-}C_3H_7}{CH_4 + H_2 + LiO - i\text{-}C_3H_7} = 5\%$, $\dfrac{CH_4}{CH_4 + H_2 + LiO - i\text{-}C_3H_7} = 85\%$ | Not measured |
| Example 5 | $\dfrac{Ca(OC_2H_5)_3}{CH_4 + H_2 + Ca(OC_2H_5)_3} = 5\%$, $\dfrac{CH_4}{CH_4 + H_2 + Ca(OC_2H_5)_3} = 85\%$ | Not measured |
| Example 6 | $\dfrac{NH_3}{CH_4 + H_2 + NH_3} = 5\%$, $\dfrac{CH_4}{CH_4 + H_2 + NH_3} = 85\%$ | C: 69.99<br>H: 30.00<br>N: 0.01 |
| Example 7 | $\dfrac{O_2}{CH_4 + H_2 + O_2} = 5\%$, $\dfrac{O_2}{CH_4 + H_2 + O_2} = 85\%$ | C: 68.3<br>H: 29.2<br>O: 2.5 |
| Example 8 | $\dfrac{H_2S}{CH_4 + H_2 + H_2S} = 5\%$, $\dfrac{CH_4}{CH_4 + H_2 + H_2S} = 85\%$ | Not measured |
| Example 9 | $\dfrac{CF_4}{CH_4 + H_2 + CF_4} = 50\%$, $\dfrac{CH_4}{CH_4 + H_2 + CF_4} = 45\%$ | C: 70.0<br>H: 15.0<br>F: 15.0 |

The physical properties of the obtained hard carbon film are shown in Table 2.

TABLE 2

| | *Ex. 1 | *Ex. 2 | *Ex. 3 | — | — | *Ex. 6 | *Ex. 7 | — | *Ex. 9 |
|---|---|---|---|---|---|---|---|---|---|
| Specific resistivity ($\rho$) ($\Omega \cdot cm$) | $10^9$ | $2 \times 10^{12}$ | $10^8$ | — | — | $10^9$ | $10^{11}$ | — | $10^{12}$ |
| Vickers hardness (kg/mm$^2$) | 4000 | 6000 | 4000 | — | — | 6000 | 6000 | — | 6000 |
| Index of Refraction | 1.8 | 2.1 | 1.7 | — | — | 2.0 | 2.0 | — | 2.1 |
| Defect density (cm$^{-3}$) | $10^{19}$ | $5 \times 10^{17}$ | $5 \times 10^{18}$ | — | — | $10^{19}$ | $2 \times 10^{18}$ | — | $10^{18}$ |
| Thickness (Å) | 900 | 900 | 900 | — | — | 900 | 900 | — | 900 |
| X-ray and electron diffractiometry | Amorphous | Amorphous | Amorphous | — | — | Amorphous | Amorphous | — | Amorphous |
| Dielectric (Å) constant | 3-4 | 3-4 | 3-4 | — | — | 3-4 | 3-4 | — | 3-4 |
| Steepness $\beta$ | 4.7-5.3 | 4.7-5.3 | 4.7-5.3 | — | — | 4.7-5.3 | 4.7-5.3 | — | 4.7-5.3 |

(Note)
*Ex.: Example

Further, after depositing Ni to a thickness of 1000 Å by vapor deposition, it was patterned to form an upper electrode.

Then, after depositing ITO as the other transparent substrate (opposed substrate) on a pyrex substrate by sputtering, it was patterned in a stripe-like shape, to form a common electrode.

Then, a polyimide film was formed as an orientation film on both of the substrates and applied with rubbing treatment.

Figure 5:
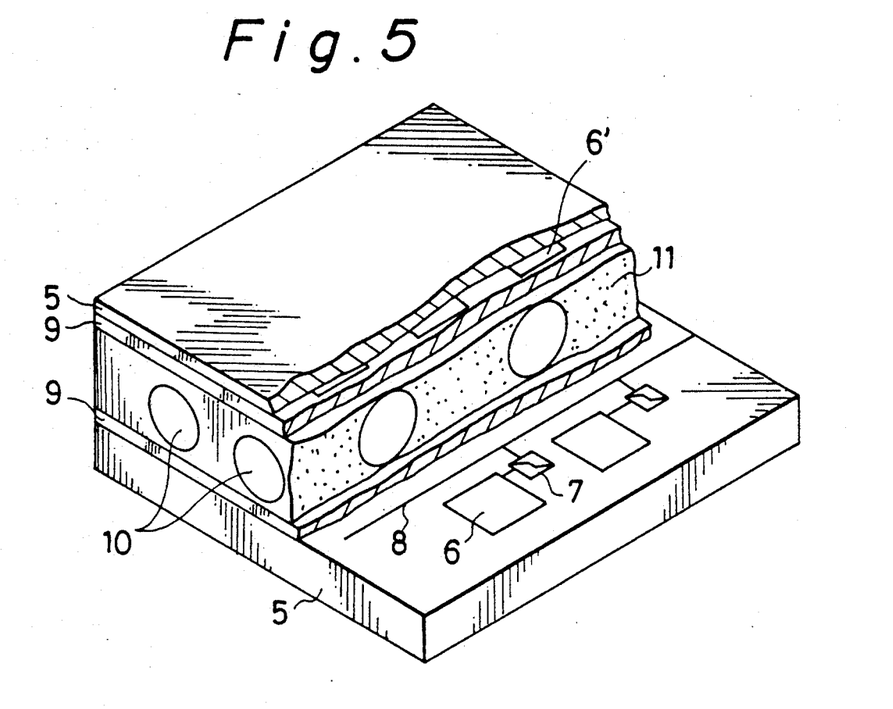
FIG. 5 is a perspective view of a liquid crystal display prepared in Examples 1–9.

Then, both of the substrates were opposed with each of their electrodes being on the inside and joined by means of a gap material (spacer) of 5 μm diameter therebetween. Further, commercially available liquid crystal material was sealed in the thus formed all to prepare a liquid crystal display as shown in FIG. 5. In FIG. 5, are shown a transparent substrate 5, a picture element electrode 6, a common electrode 6', an MIM device 7, a common electrode or common wiring 8, an orientation film 9, a gap material 10 and a liquid crystal material 11.

In the case of Example 1, the specific resistivity of the hard carbon film can be reduced by about three orders as compared with the non-doped film, and the film thickness of the hard carbon film used for the MIM device can be increased by about twice as compared with that of the non-doped film. As a result, rate of occurrence for device defects due to pin-holes, that is, display defects is reduced as shown in Table 3. Phosphine doped film in Example 3 have the same effects as described above.

TABLE 3

| Form of film | Defect occurrence rate* |
|---|---|
| Non-doped film | 0.015% |
| Boron doped film (Example 1) | 0.002% |

(Note)
*The defect occurrence rate is evaluated by the number of defects in 100,000 bits.

In Example 9, since the thermal stability of the hard carbon film is improved and further, dangling bonds in the film is reduced, mean time between fault (MTBF) during continuous operation of the device is outstandingly improved. The results are shown in Table 4. The film of Example 2 also has the same effect.

TABLE 4

| Form of film | MTBF* (hr) |
| --- | --- |
| Non-doped film | 32,000 |
| Boron doped film (Example 9) | 120,000 |

(Note)
*MTBF = Means Time Between Fault

EXAMPLES 10–18

Figure 6:
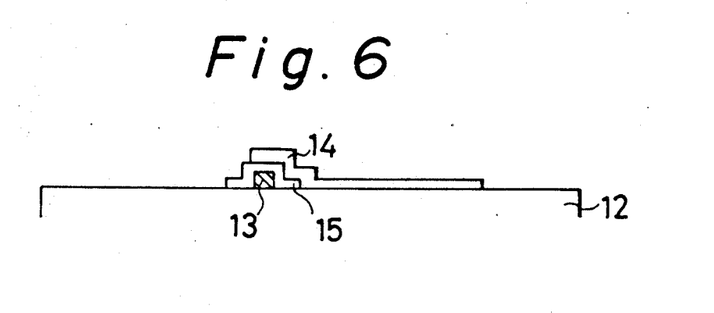
FIG. 6 is a cross sectional view of an MIM device prepared in Examples 10–18.

Each of thin films of Al was formed to a thickness of 1000 Å on a glass substrate by vapor deposition and then patterned by etching to form a lower metal electrode, over which a hard carbon film of 800 Å thickness was covered by the same method as in each of Examples 1 to 9, and then patterned by dry etching to form an insulator layer. Further, an ITO film of 1000 Å thickness was deposited by vapor deposition on each of the hard carbon films and then patterned by etching to form a transparent upper picture element electrode, thereby preparing an MIM device shown in FIG. 6. In FIG. 6, are shown a transparent substrate 12, a metal electrode 13, a transparent electrode 14 and a hard carbon insulator layer 15.

Then, after depositing ITO to a thickness of 500 Å on a plastic film as an opposed substrate, it was patterned in a stripe-like shape to form a common electrode. Successively, the same polyimide film as in Example 1 was disposed thereover and applied with rubbing treatment.

After joining the two substrates by means of a gap material therebetween in the same method as in Examples 1 to 9, commercially available liquid crystal material was sealed, to prepared a liquid crystal display.

EXAMPLES 19–27

Figure 7:
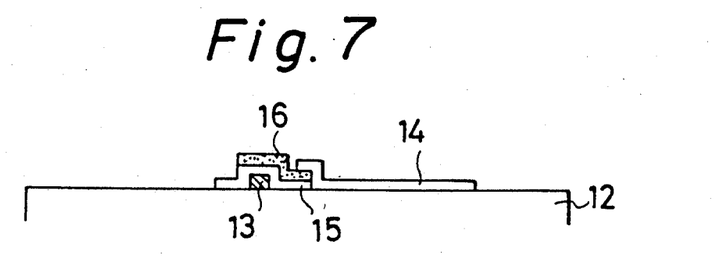
FIG. 7 is a cross sectional view of an MIM device prepared in Examples 19–27.

After forming each of lower metal electrodes and hard carbon films as the insulator layer on a glass plate in the same method as in Examples 1 to 9, a Pt film of 500 Å in thickness was formed on each of the hard carbon films by vapor deposition and patterned to form an auxiliary electrode. Further, the transparent upper picture element electrode was formed thereover in the same method as in Examples 10 to 18, to prepare an MIM device shown in FIG. 7. In FIG. 7, are shown a transparent substrate 12, a metal electrode 13, a transparent electrode 14, a hard carbon insulator layer 15 and an auxiliary electrode 16.

Then, after depositing ITO to a thickness of 800 Å on a pyrex substrate as an opposed substrate by magnetron sputtering, it was patterned stripe-like shape to form a common electrode. Successively, a polyimide film was disposed in the same method as in Examples 1 to 9 and applied with rubbing treatment, the two substrates are joined by means of a gap material therebetween in the same method as in Examples 1 to 9, the commercially available liquid crystal material was sealed to prepare a liquid crystal display.

EXAMPLES 28–36

Figure 8A:
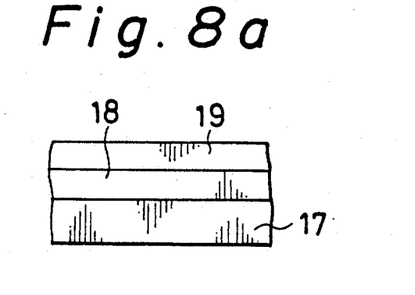
FIGS. 8(a) (d) are step charts for the production of an MIM device prepared in Examples 28-36.
Figure 8B:
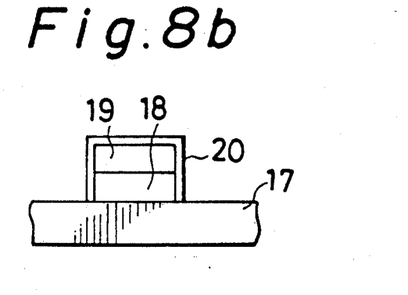

As shown in FIG. 8(a), a lower electrode 18 and a hard carbon film 19 were laminated on a transparent substrate 17. NiCr was used as the material for the lower electrode 18 and film thickness was 7000 Å. The hard carbon film 19 was made of the same material as in Examples 1 to 9 and the film thickness was 5000 Å. Then, as shown in FIG. 8(b), the hard carbon film 19 and the lower electrode 18 were successively etched by dry etching and patterned into a predetermined pattern. The treatment for successively etching the hard carbon film 19 and the lower electrode 18 can be conducted continuously by selecting and setting gas species, pressure, discharge power, etc. within an identical chamber.

Figure 8C:
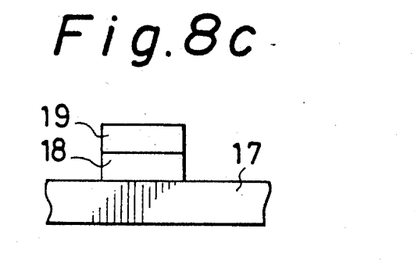

Further as shown in FIG. 8(c), a second hard carbon film 20 was formed so as to cover the upper surface and the side of the patterned hard carbon film 19 and the side of the lower electrode 18. The film thickness of the second hard carbon film 20 (the composition was the same as in Examples 1 to 9) was 400 Å.

The insulation film of the MIM device was constituted with the hard carbon films 19, 20, in which the film thickness was greater at the surface of the lower electrode 18 on which the hard carbon films 19, 20 were laminated as the sum of both of the films, while the film thickness is reduced in the stepped portion, that is, on the side of the electrode 11 since only the hard carbon film 10 was present.

Figure 8D:
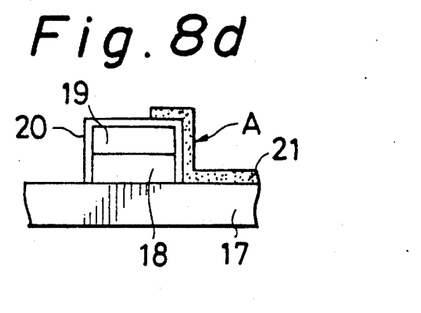

Further, as shown in FIG. 8(d), a transparent electrode 21 as a picture element electrode was formed by EB vapor deposition and applied with predetermined patterning. The transparent electrode 21 was made of ITO and to a film thickness of 900 Å.

With such a constitution, the portion operating as the MIM device was at the side of the lower electrode where the thickness of the hard carbon film 20 was thin, i.e., the portion A in which the lower electrode (metal) 18 the second hard carbon film (insulator layer) 20 transparent electrode (metal) 21 were laminated in the lateral direction. The area of the MIM device was determined by the stepped portion of the lower electrode 18 (film thickness) and the pattern of the transparent electrode 21.

Figure 9:
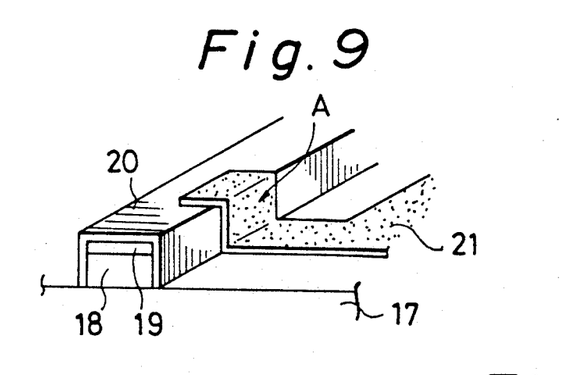
FIG. 9 is a perspective view of the MIM device prepared in Examples 28-36.

FIG. 9 shows a perspective view of the MIM device. A polyimide film was disposed on the substrate on the thus obtained MIM device in the same method as in Example 1 to 9 and applied with rubbing treatment.

Then, after depositing ITO as an opposed substrate to a thickness of 500 Å on a plastic film by sputtering, it was patterned in a stripe-like shape to form a common electrode. Successively, a polyimide film was disposed thereover in the same method as in Examples 1 to 9 and applied with rubbing treatment.

After joining the two substrates by means of a gap material therebetween as in Examples 1 to 9, commercially available liquid crystal material was sealed to prepared a liquid crystal display.

EXAMPLES 37–45

Figure 10:
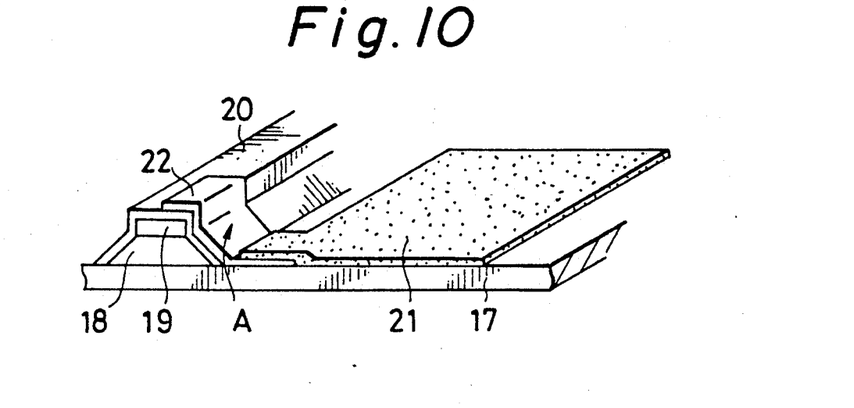
FIG. 10 is a perspective view of an MIM device prepared in Examples 37-45.

As shown in FIG. 10, an upper electrode 22 for the portion of an MIM device was formed independently so as to establish an electric connection with a transparent electrode 21.

At first, a lower electrode 18, and a hard carbon film 19 were laminated on a substrate 17. The materials were the same as those in Examples 28 to 36 and these layers were successively patterned by dry etching into predetermined pattern. In this case, etching for the lower electrode 18 was applied such that the stepped portion had a tapered cross section. With such a tapered shape, the stepped portion of the second hard carbon film 20 formed in the succeeding step, i.e., the film thickness and the uniformness thereof on the tapered surface could be controlled more easily. The film thickness of the hard carbon film 20 was the same as in Examples 28 to 36. Then, after forming the second hard carbon film 20 in the same method as in Examples 28 to 36, an upper electrode 22 was formed from a portion on the hard carbon film 20 to the substrate 17. The upper electrode 22 was formed to a thickness of 4000 Å by using the same material as for the lower material electrode 18.

Subsequently, a transparent electrode 21 as a picture element electrode was formed and patterned such that a portion thereof lies on the upper electrode 22. As a result, the transparent 21 and the hard carbon film 10 were not brought into direct contact with each other and no degradation occurred in the bonding state accompanying the denaturation of the surface of the hard carbon film upon forming the transparent electrode 21, by which the device characteristic could be stabilized more.

A polyimide film was disposed on the thus obtained MIM device substrate in the same method as in Examples 1 to 9 and applied with rubbing treatment.

Then, after depositing ITO as an opposed substrate to a thickness of 500 Å on the glass substrate by sputtering, it was patterned into a stripe-like shape to form a common electrode. Successively, a polyimide film was disposed thereover in the same method as in Examples 1 to 9 and applied with rubbing treatment.

After joining the two substrates by means of a gap material therebetween in the same method as in Examples 1 to 9, commercially available liquid crystal material was sealed to prepare a liquid crystal display.

EXAMPLES 46-54

After depositing ITO as one of transparent substrates to a thickness of 1000 Å on a plastic substrate by sputtering, it was patterned to form a picture element electrode. Then, after depositing Al to a thickness of 1000 Å thereover by vapor deposition, it was patterned to form a lower common electrode. Then, after depositing a hard carbon film to a thickness of 600 Å thereover as an insulator layer in the same method as in Examples 1 to 9 by plasma CVD, it was patterned by dry etching. Further, after vapor depositing Cr thereover to a thickness of 2000 Å, it was patterned to form an upper electrode. Subsequently, a polyimide film was disposed in the same as in Examples 1 to 9 and applied with rubbing treatment.

Then, after depositing ITO as an opposed substrate to a thickness of 500 Å on a plastic film by sputtering, it was patterned into a stripe-like shape to form a common electrode. Successively, a polyimide film was disposed thereover in the same method as in Examples 1 to 9 and applied with rubbing treatment. Then, a color filter 23 was attached on the opposite side.

Figure 11:
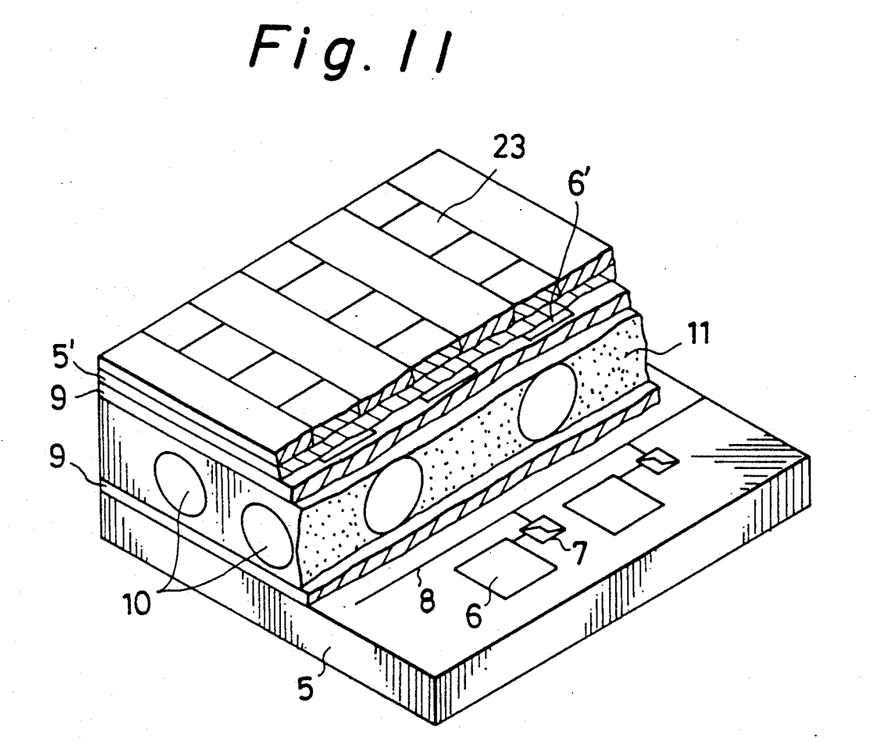
FIG. 11 is a perspective view of a color liquid crystal display prepared in Examples 45-54.

After joining two substrates by means of a gap material therebetween as in Examples 1 to 9, commercially available liquid crystal material was sealed to form a color liquid crystal display as shown in FIG. 11.

What is claimed is:

1. An MIM device comprising:
   a lower electrode,
   an upper electrode, and
   a hard carbon film sandwiched between said lower electrode and said upper electrode as insulator layer, the hard carbon film containing at least one of the elements selected from the group consisting of a group IV element other than carbon of the periodic table, an alkali metal element, an alkaline earth metal element, oxygen, a chalcogen element and a halogen element as one of constituent elements,
   the amount of the group IV element being 0.01 to 20 atomic % based on the whole constituent atoms, the amount of the alkali metal element being 0.001 to 5 atomic % based on the whole constituent atoms, the amount of the alkaline earth metal element being 0.001 to 5 atomic % based on the whole constituent atoms, the amount of the oxygen being 0.001 to 5 atomic % based on the whole constituent atoms, the amount of the chalcogen element being 001 to 20 atomic % based on the whole constituent atoms, and the amount of the halogen element being 0.1 to 35 atomic % based on the whole constituent atoms.

2. An MIM device according to claim 1, wherein the hard carbon film has specific resistivity ($\rho$) of from $10^6$ to $10^{14}$ ohm·cm, Vickers hardness (H) of from 2500 to 9500 kg/mm$^2$, index of refraction (n) of from 1.7 to 2.6, defect density of from $10^{16}$ to $10^{19}$ cm$^{-3}$, steepness $\beta$ of from 2 to 18 and specific dielectric constant of from 2 to 6.

3. An MIM device according to claim 1, wherein the hard carbon film is in an amorphous state or in an amorphous state containing fine crystal grains with a grain size of from 50 Å to 5 μm.

4. An MIM device according to claim 1, wherein the group IV element is selected from Si, Ge and Sn.

5. An MIM device according to claim 1, wherein the alkali metal element is selected from Li, Na and K.

6. An MIM device according to claim 1, wherein the alkaline earth metal element is selected from Ca and Mg.

7. An MIM device according to claim 1, wherein the chalcogen element is selected from S, Se and Te.

8. An MIM device according to claim 1, wherein the halogen element is selected from F, Cl, Br and I.

9. An MIM device according to claim 1, wherein the element contained in the hard carbon film is a Group IV element other than carbon and wherein the amount of the group IV element is not more than 20 atomic % based on the whole constituent atoms.

10. An MIM device according to claim 1, wherein the element contained in the hard carbon film is an alkali metal element and wherein the amount of the alkali metal element is not more than 5 atomic % based on the whole constituent atoms.

11. An MIM device according to claim 1, wherein the element contained in the hard carbon film is an alkaline earth metal element and wherein the amount of the alkaline earth metal element is not more than 5 atomic % based on the whole constituent atoms.

12. An MIM device according to claim 1, wherein the element contained in the hard carbon film is oxygen and wherein the amount of the oxygen atom is not more than 5 atomic % based on the whole constituent atoms.

13. An MIM device according to claim 1, wherein the element contained in the hard carbon film a chalcogen element and wherein the amount of the chalcogen element is not more than 20 atomic % based on the whole constituent atoms.

14. An MIM device according to claim 1, wherein the element contained in the hard carbon film is a halogen element and wherein the amount of the halogen element is not more than 35 atomic % based on the whole constituent atoms.

15. An MIM device according to claim 1, wherein the thickness of the hard carbon film is from 100 to 8,000 Å.

16. An MIM device according to claim 1, wherein the lower electrode is composed of Al, Ni, Ni-Cr alloy, Mo, Cr, Ti, Zr, Nb, Au, Ag, Pt or Cu.

17. An MIM device according to claim 1, wherein the upper electrode is composed of Al, Ni, Ni-Cr alloy, Mo, Cr, Ti, Zr, Nb, Au, Ag, Pt or Cu.

18. An MIM device according to claim 1, used in combination with a liquid crystal display.

* * * * *